United States Patent
Azadet et al.

(10) Patent No.: US 10,044,367 B1
(45) Date of Patent: Aug. 7, 2018

(54) ARBITRARY NOISE SHAPING TRANSMITTER WITH RECEIVE BAND NOTCHES

(71) Applicant: Intel Corporation, Santa Clara, CA (US)

(72) Inventors: Kameran Azadet, San Ramon, CA (US); Ramon Sanchez, Galapagar (ES)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/671,888

(22) Filed: Aug. 8, 2017

(51) Int. Cl.
  *H03M 3/00* (2006.01)
  *H03L 7/20* (2006.01)
  *H03L 7/16* (2006.01)
  *G10L 19/03* (2013.01)
  *H03M 1/00* (2006.01)

(52) U.S. Cl.
  CPC .............. *H03M 3/33* (2013.01); *G10L 19/03* (2013.01); *H03L 7/16* (2013.01); *H03L 7/20* (2013.01); *H03M 1/007* (2013.01); *H03M 3/436* (2013.01); *H03L 2207/50* (2013.01)

(58) Field of Classification Search
  CPC ........ H03M 3/33; H03M 1/007; H03M 3/436; H03L 7/16; H03L 7/20; G10L 19/03
  USPC .................................................... 341/143, 120
  See application file for complete search history.

(56) References Cited

U.S. PATENT DOCUMENTS

| | | | |
|---|---|---|---|
| 8,421,661 B1 * | 4/2013 | Jee ........................ | G04F 10/005 341/143 |
| 8,890,634 B2 * | 11/2014 | Mahoney ................ | H03M 3/50 332/103 |
| 8,897,400 B2 * | 11/2014 | Felbach ................ | G06F 1/0328 375/316 |
| 9,742,428 B2 * | 8/2017 | Choi ..................... | H03M 3/422 |

* cited by examiner

*Primary Examiner* — Brian Young
(74) *Attorney, Agent, or Firm* — Eschweiler & Potashnik, LLC

(57) ABSTRACT

Techniques for generating signals with arbitrary noise shaping are discussed. One example apparatus configured to be employed within a transmitter can comprise a noise shaper configured to: receive an input signal $x_q$; and apply noise shaping to the input signal $x_q$ to generate a noise shaped output signal $y_q$, wherein an in-band noise of the noise shaped output signal $y_q$ is below an in-band noise threshold of a spectral mask associated with the noise shaper, wherein an out-of-band noise of the noise shaped output signal $y_q$ is below an out-of-band noise threshold of the spectral mask, and wherein a noise of the output signal $y_q$ in each of a plurality of bandpass regions is below an associated noise threshold for that bandpass region of the spectral mask.

19 Claims, 10 Drawing Sheets

US 10,044,367 B1

ARBITRARY NOISE SHAPING TRANSMITTER WITH RECEIVE BAND NOTCHES

FIELD

The present disclosure relates to wireless technology, and more specifically to techniques for arbitrary noise shaping in a transmitter to fit a spectral mask, for example, one comprising one or more receive band notches.

BACKGROUND

Transmitters in wireless communication devices (e.g., UEs (User Equipments), BSs (Base Stations) generate a transmit signal within a transmission band, and can potentially generate significant noise outside of the transmission band. This noise can exceed target noise levels for one or more reasons, such as exceeding target ACLR(s) (Adjacent Channel Leakage Ratio(s)), exceeding target noise in Rx (Receive) band(s), exceeding target noise for out-of-band emissions, etc. To meet these target noise levels, noise shaping can be employed to ensure that the transmitter design meets or exceeds a spectral mask that incorporates these targets.

DETAILED DESCRIPTION

Figure 1:
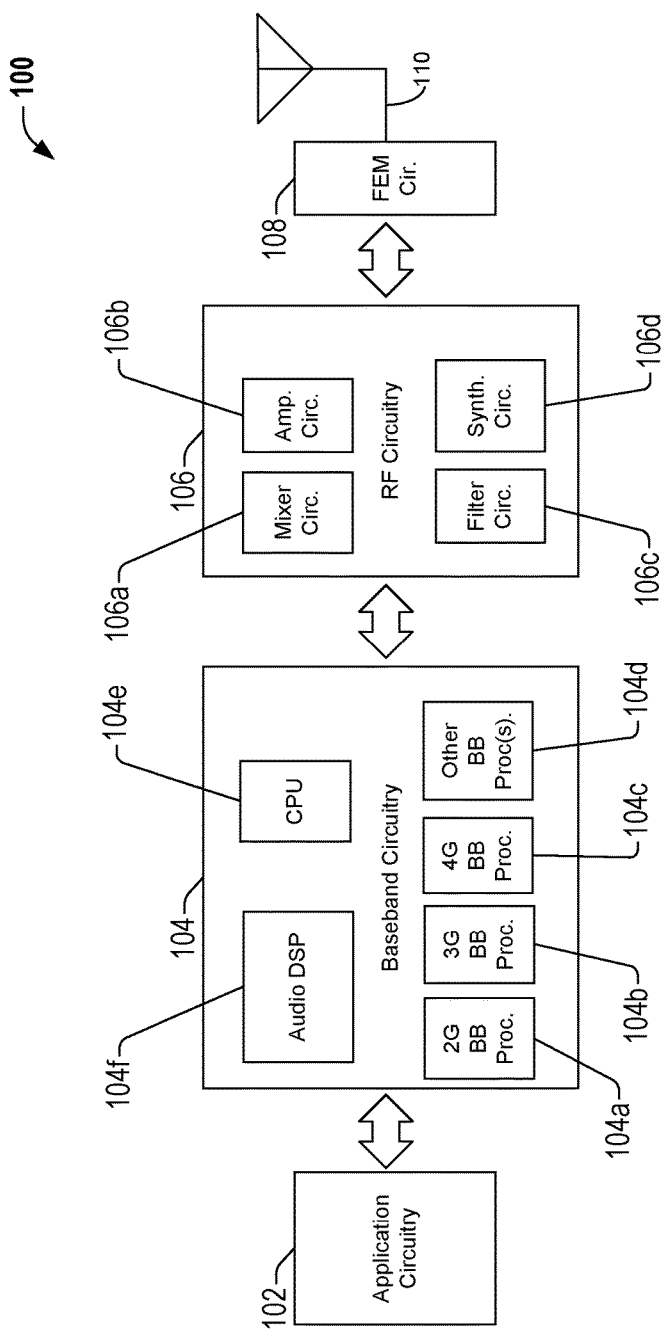
FIG. 1 is a block diagram illustrating an example user equipment (UE) useable in connection with various aspects described herein.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising."

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

Embodiments described herein may be implemented into a system using any suitably configured hardware and/or software. FIG. 1 illustrates, for one embodiment, example components of a User Equipment (UE) device 100. In some embodiments, the UE device 100 may include application circuitry 102, baseband circuitry 104, Radio Frequency (RF) circuitry 106, front-end module (FEM) circuitry 108 and one or more antennas 110, coupled together at least as shown.

The application circuitry 102 may include one or more application processors. For example, the application circuitry 102 may include circuitry such as, but not limited to, one or more single-core or multi-core processors. The processor(s) may include any combination of general-purpose processors and dedicated processors (e.g., graphics processors, application processors, etc.). The processors may be coupled with and/or may include memory/storage and may be configured to execute instructions stored in the memory/storage to enable various applications and/or operating systems to run on the system.

The baseband circuitry 104 may include circuitry such as, but not limited to, one or more single-core or multi-core processors. The baseband circuitry 104 may include one or more baseband processors and/or control logic to process baseband signals received from a receive signal path of the RF circuitry 106 and to generate baseband signals for a transmit signal path of the RF circuitry 106. Baseband processing circuity 104 may interface with the application circuitry 102 for generation and processing of the baseband signals and for controlling operations of the RF circuitry 106. For example, in some embodiments, the baseband circuitry 104 may include a second generation (2G) baseband processor 104a, third generation (3G) baseband processor 104b, fourth generation (4G) baseband processor 104c, and/or other baseband processor(s) 104d for other existing generations, generations in development or to be developed in the future (e.g., fifth generation (5G), 6G, etc.). The baseband circuitry 104 (e.g., one or more of baseband processors 104a-d) may handle various radio control functions that enable communication with one or more radio networks via the RF circuitry 106. The radio control functions may include, but are not limited to, signal modulation/demodulation, encoding/decoding, radio frequency shifting, etc. In some embodiments, modulation/demodulation circuitry of the baseband circuitry 104 may include Fast-Fourier Transform (FFT), precoding, and/or constellation mapping/demapping functionality. In some embodiments, encoding/decoding circuitry of the baseband circuitry 104 may include convolution, tail-biting convolution, turbo, Viterbi, and/or Low Density Parity Check (LDPC) encoder/decoder functionality. Embodiments of modulation/demodulation and encoder/decoder functionality are not limited to these examples and may include other suitable functionality in other embodiments.

In some embodiments, the baseband circuitry 104 may include elements of a protocol stack such as, for example, elements of an evolved universal terrestrial radio access network (EUTRAN) protocol including, for example, physical (PHY), media access control (MAC), radio link control (RLC), packet data convergence protocol (PDCP), and/or radio resource control (RRC) elements. A central processing unit (CPU) 104e of the baseband circuitry 104 may be configured to run elements of the protocol stack for signaling of the PHY, MAC, RLC, PDCP and/or RRC layers. In some embodiments, the baseband circuitry may include one or more audio digital signal processor(s) (DSP) 104f. The audio DSP(s) 104f may include elements for compression/decompression and echo cancellation and may include other suitable processing elements in other embodiments. Components of the baseband circuitry may be suitably combined in a single chip, a single chipset, or disposed on a same circuit board in some embodiments. In some embodiments, some or all of the constituent components of the baseband circuitry 104 and the application circuitry 102 may be implemented together such as, for example, on a system on a chip (SOC).

In some embodiments, the baseband circuitry 104 may provide for communication compatible with one or more radio technologies. For example, in some embodiments, the baseband circuitry 104 may support communication with an evolved universal terrestrial radio access network (EUTRAN) and/or other wireless metropolitan area networks (WMAN), a wireless local area network (WLAN), a wireless personal area network (WPAN). Embodiments in which the baseband circuitry 104 is configured to support radio communications of more than one wireless protocol may be referred to as multi-mode baseband circuitry.

RF circuitry 106 may enable communication with wireless networks using modulated electromagnetic radiation through a non-solid medium. In various embodiments, the RF circuitry 106 may include switches, filters, amplifiers, etc. to facilitate the communication with the wireless network. RF circuitry 106 may include a receive signal path which may include circuitry to down-convert RF signals received from the FEM circuitry 108 and provide baseband signals to the baseband circuitry 104. RF circuitry 106 may also include a transmit signal path which may include circuitry to up-convert baseband signals provided by the baseband circuitry 104 and provide RF output signals to the FEM circuitry 108 for transmission.

In some embodiments, the RF circuitry 106 may include a receive signal path and a transmit signal path. The receive signal path of the RF circuitry 106 may include mixer circuitry 106a, either as multiplication of signals or as a sampling of the signal, amplifier circuitry 106b and filter circuitry 106c. The transmit signal path of the RF circuitry 106 may include filter circuitry 106c and mixer circuitry 106a. RF circuitry 106 may also include synthesizer circuitry 106d for synthesizing a frequency for use by the mixer circuitry 106a of the receive signal path and the transmit signal path. In some embodiments, the mixer circuitry 106a of the receive signal path may be configured to down-convert RF signals received from the FEM circuitry 108 based on the synthesized frequency provided by synthesizer circuitry 106d. The amplifier circuitry 106b may be configured to amplify the down-converted signals and the filter circuitry 106c may be a low-pass filter (LPF) or bandpass filter (BPF) configured to remove unwanted signals from the down-converted signals to generate output baseband signals. Output baseband signals may be provided to the baseband circuitry 104 for further processing. In some embodiments, the output baseband signals may be zero-frequency baseband signals, although this is not a requirement. In some embodiments, mixer circuitry 106a of the receive signal path may comprise passive mixers, although the scope of the embodiments is not limited in this respect.

In some embodiments, the mixer circuitry 106a of the transmit signal path may be configured to up-convert input baseband signals based on the synthesized frequency provided by the synthesizer circuitry 106d to generate RF output signals for the FEM circuitry 108. The baseband signals may be provided by the baseband circuitry 104 and may be filtered by filter circuitry 106c. The filter circuitry 106c may include a low-pass filter (LPF), although the scope of the embodiments is not limited in this respect.

In some embodiments, the mixer circuitry 106a of the receive signal path and the mixer circuitry 106a of the transmit signal path may include two or more mixers and may be arranged for quadrature down conversion and/or up conversion respectively. In some embodiments, the mixer circuitry 106a of the receive signal path and the mixer circuitry 106a of the transmit signal path may include two or more mixers and may be arranged for image rejection (e.g., Hartley image rejection). In some embodiments, the mixer circuitry 106a of the receive signal path and the mixer circuitry 106a may be arranged for direct down conversion and/or direct up conversion, respectively. In some embodiments, the mixer circuitry 106a of the receive signal path and the mixer circuitry 106a of the transmit signal path may be configured for super-heterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In these alternate embodiments, the RF circuitry 106 may include analog-to-digital converter (ADC) and digital-to-analog converter (DAC) circuitry and the baseband circuitry 104 may include a digital baseband interface to communicate with the RF circuitry 106.

In some dual-mode embodiments, a separate radio IC circuitry may be provided for processing signals for each spectrum, although the scope of the embodiments is not limited in this respect.

In some embodiments, the synthesizer circuitry 106d may be a fractional-N synthesizer or a fractional N/N+1 synthesizer, although the scope of the embodiments is not limited in this respect as other types of frequency synthesizers may be suitable. For example, synthesizer circuitry 106d may be a delta-sigma synthesizer, a frequency multiplier, or a synthesizer comprising a phase-locked loop with a frequency divider.

The synthesizer circuitry 106d may be configured to synthesize an output frequency for use by the mixer circuitry 106a of the RF circuitry 106 based on a frequency input and a divider control input. In some embodiments, the synthesizer circuitry 106d may be a fractional N/N+1 synthesizer.

In some embodiments, frequency input may be provided by a voltage controlled oscillator (VCO), although that is not a requirement. Divider control input may be provided by either the baseband circuitry 104 or the applications processor 102 depending on the desired output frequency. In some embodiments, a divider control input (e.g., N) may be determined from a look-up table based on a channel indicated by the applications processor 102.

Synthesizer circuitry 106d of the RF circuitry 106 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 106d may be configured to generate a carrier frequency as the output frequency, while in other embodiments, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency may be a LO frequency (fLO). In some embodiments, the RF circuitry 106 may include an IQ/polar converter.

FEM circuitry 108 may include a receive signal path which may include circuitry configured to operate on RF signals received from one or more antennas 110, amplify the received signals and provide the amplified versions of the received signals to the RF circuitry 106 for further processing. FEM circuitry 108 may also include a transmit signal path which may include circuitry configured to amplify signals for transmission provided by the RF circuitry 106 for transmission by one or more of the one or more antennas 110.

In some embodiments, the FEM circuitry 108 may include a TX/RX switch to switch between transmit mode and receive mode operation. The FEM circuitry may include a receive signal path and a transmit signal path. The receive signal path of the FEM circuitry may include a low-noise amplifier (LNA) to amplify received RF signals and provide the amplified received RF signals as an output (e.g., to the RF circuitry 106). The transmit signal path of the FEM circuitry 108 may include a power amplifier (PA) to amplify input RF signals (e.g., provided by RF circuitry 106), and one or more filters to generate RF signals for subsequent transmission (e.g., by one or more of the one or more antennas 110).

In some embodiments, the UE device 100 may include additional elements such as, for example, memory/storage, display, camera, sensor, and/or input/output (I/O) interface.

Figure 2:
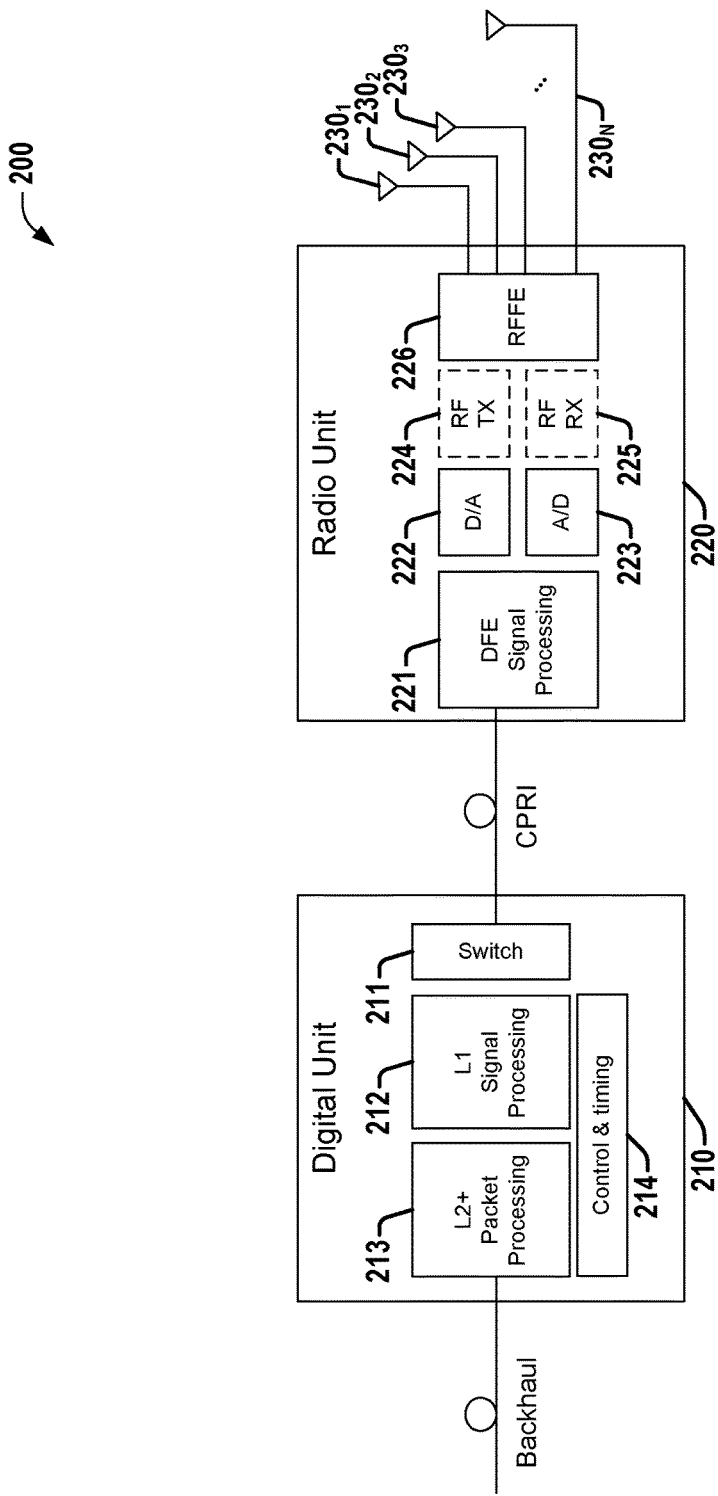
FIG. 2 is a block diagram illustrating example components of a Base Station (BS) device (e.g., eNB, gNB, etc.) that can be employed in connection with various aspects discussed herein.

Referring to FIG. 2, illustrated are example components of a Base Station (BS) device (e.g., eNB, gNB, etc.) 200 that can be employed in connection with various aspects discussed herein. In some embodiments, the BS device 200 can comprise a digital unit 210 and one or more radio units 220, each of which can be connected to one or more antennas $230_j$.

The digital unit 210 can comprise a switch 211, layer 1 (L1) signal processing circuitry 212, layer 2+(L2+) packet processing circuitry 213, and control and timing circuitry 214. The digital unit 210 can perform at least the following functions: (a) Switching (e.g., via switch 211) between various radio units (on cell towers or roof tops), and various baseband cards, in the digital unit; (b) Layer 1 signal processing (e.g., via L1 signal processing circuitry 212), performing the modulation/demodulation and forward error correction functions of actual waveforms to be transmitted on different RF carriers and bands; (c) Layer 2 scheduling of users (e.g., via L2+ packet processing circuitry 213); (d) Layer 2/layer 3 packet processing (e.g., via L2+ packet processing circuitry 213); (e) Control plane processing and timing/synchronization (e.g., via control and timing circuitry 214); and (f) Encryption of packets going into the backhaul (e.g., via control and timing circuitry 214).

Each radio unit 220 can comprise DFE (Digital Front End) signal processing circuitry 221, one or more digital to analog converters (DACs) 222 associated with transmit chain(s), one or more analog to digital converters (ADCs) 223 associated with receive chain(s), optional RF (Radio Frequency) transmit circuitry 224 associated with transmit chain(s), optional RF (Radio Frequency) receive circuitry 225 associated with receive chain(s), and RF FE (Front End) circuitry 226. The digital unit 210 can perform at least the following functions: (a) Digital front-end (DFE) signal processing (perform digital IF carrier combining, crest factor reduction, digital pre-distortion of Power Amplifiers) (e.g., via DFE signal processing circuitry 221); (b) Digital to Analog and Analog to Digital conversion (e.g., via DACs 222 and ADCs 223); (c) RF mixing (i.e. modulation), and RF frequency synthesizers; (d) RF Front-end functions: power amplifiers (PA), low-noise amplifiers (LNA), Variable gain amplifiers (VGA), filters, switches (TDD) or duplexers (FDD) (e.g., via RF front end circuitry 226). In aspects omitting RF transmit circuitry 224 and/or RF receive circuitry 225, The DACs 222 and/or ADCs 223 can work at RF sampling rates, making analog/RF modulation/demodulation unnecessary.

From radio unit(s) 220, the RF signal can be fed to antennas 230$_i$. In current radio base-stations, antennas are external, and there is an industry effort to develop Active antenna systems (AAS) with integrated RF and antenna arrays, for example, for 5G.

Various embodiments disclosed herein can generate an arbitrary noise shape that can fit a given spectral mask. Based on techniques discussed herein, this spectral mask can be fit using a lower resolution DAC (Digital to Analog Converter) than based on conventional techniques. In various aspects, a noise shaper as described herein can be employed to generate a spectral mask that meets one or more noise thresholds. These noise thresholds can be associated with one or more ACLRs, one or more Rx bands, out-of-band emission targets (e.g., based on legal/regulatory guidance), etc.

Transmit noise due to DAC quantization causes interference with Rx bands. These Rx bands can be for a receiver of the same radio technology or other technology (e.g. cellular transmitter noise into own receive band, GPS (global positioning system) receiver, WiFi received signal, etc.). Conventionally, this has been mitigated by the use of expensive front-end filters in both handset (e.g., UE) and base station (e.g., eNB (E-UTRAN (Evolved Universal Terrestrial Radio Access Network (E-UTRAN) Node B), Evolved Node B, or eNodeB), gNB (next Generation NodeB, g NodeB), etc.) applications.

In various embodiments, techniques discussed herein can be employed to perform arbitrary noise shaping of a transmit signal. This can allow for the use of a coarser DAC than conventionally employed to achieve a performance similar to a very high resolution DAC, by introducing arbitrary out-of-band noise shaping. In various examples, this arbitrary out-of-band noise shaping can include a number of Rx notches (e.g., one or more Rx notches (e.g., 2, etc.) for carrier aggregation or for receive bands of other systems). These notches can be designed to have a precise shape, which can include an arbitrary BW (bandwidth). In various aspects, noise shaping according to embodiments discussed herein can be performed in such a way that the Rx noise level can be maintained the same for various DAC resolutions, for example, from 8b to 10b. In various aspects discussed herein, an arbitrary spectral mask can be met with front-end filtering that is less stringent than conventional systems, and/or a transmit DAC having lesser resolution than conventional systems, either (or both) of which can reduce complexity and cost.

In aspects discussed herein, a digital implementation can be employed (e.g., which can be multiplier-less and can employ a LUT (Look-Up Table)), which can shape the noise to any arbitrary shape. In various aspects, filter taps of a noise shaping filter employed in various aspects can be pre-computed in the frequency domain to design the inverse of a target shape for filter synthesis from which the impulse response can be derived, which can allow for a highly controlled response in both the Tx band and Rx band(s). The filter tap values can then be calculated in the time domain based on the pre-computed frequency domain shape.

Figure 3:
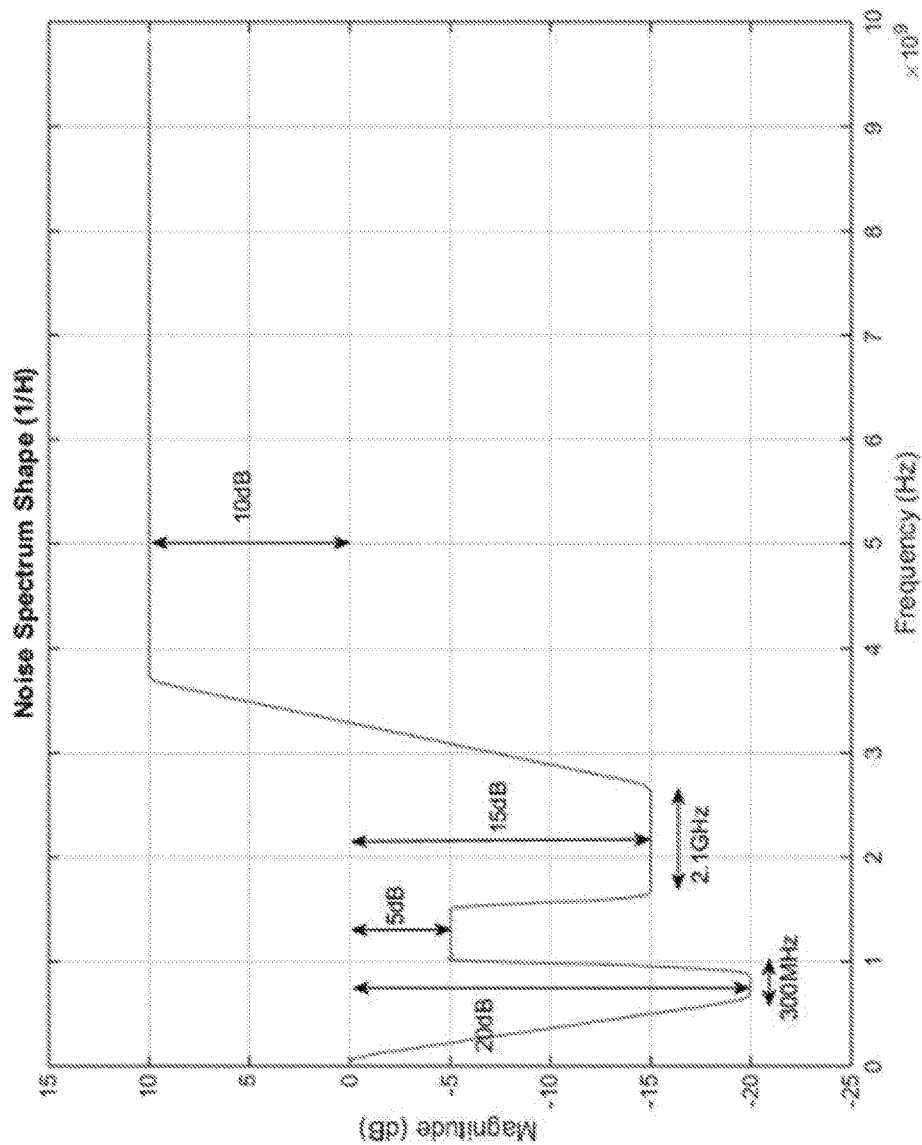
FIG. 3 is a diagram illustrating an example of an arbitrary noise shape spectrum that can be met via noise shaping techniques discussed herein.

In various embodiments, techniques discussed herein can be employed in a transmitter that can be designed to meet a spectral mask that meets various conditions in terms of one or more of ACLR, noise in Rx band(s), out-of-band emissions, etc. Referring to FIG. 3, illustrated is an example of an arbitrary noise shape spectrum (e.g., wherein a noise shaping filter according to aspects discussed herein can be the inverse of that spectrum) that can be met via noise shaping techniques discussed herein. Although FIG. 3 illustrates a specific noise spectrum shape as an example, in various aspects discussed herein, the relative attenuation of the different bands, their positions, widths and transition sharpness in the frequency domain can be arbitrarily selected.

FIG. 3 illustrates one example of a spectral mask showing various conditions that can be satisfied via noise shaping techniques discussed herein. The spectral mask of FIG. 3 shows example DRs (Dynamic Ranges, differences between the signal and noise power spectrum level) defined in various BWs (bandwidths) around certain frequencies and for a system BW around the baseband signal and at other out-of-band locations. Although FIG. 3 shows a specific spectral mask for the purposes of illustration, techniques discussed herein can be employed for noise shaping to satisfy an arbitrary spectral mask.

Figure 4:
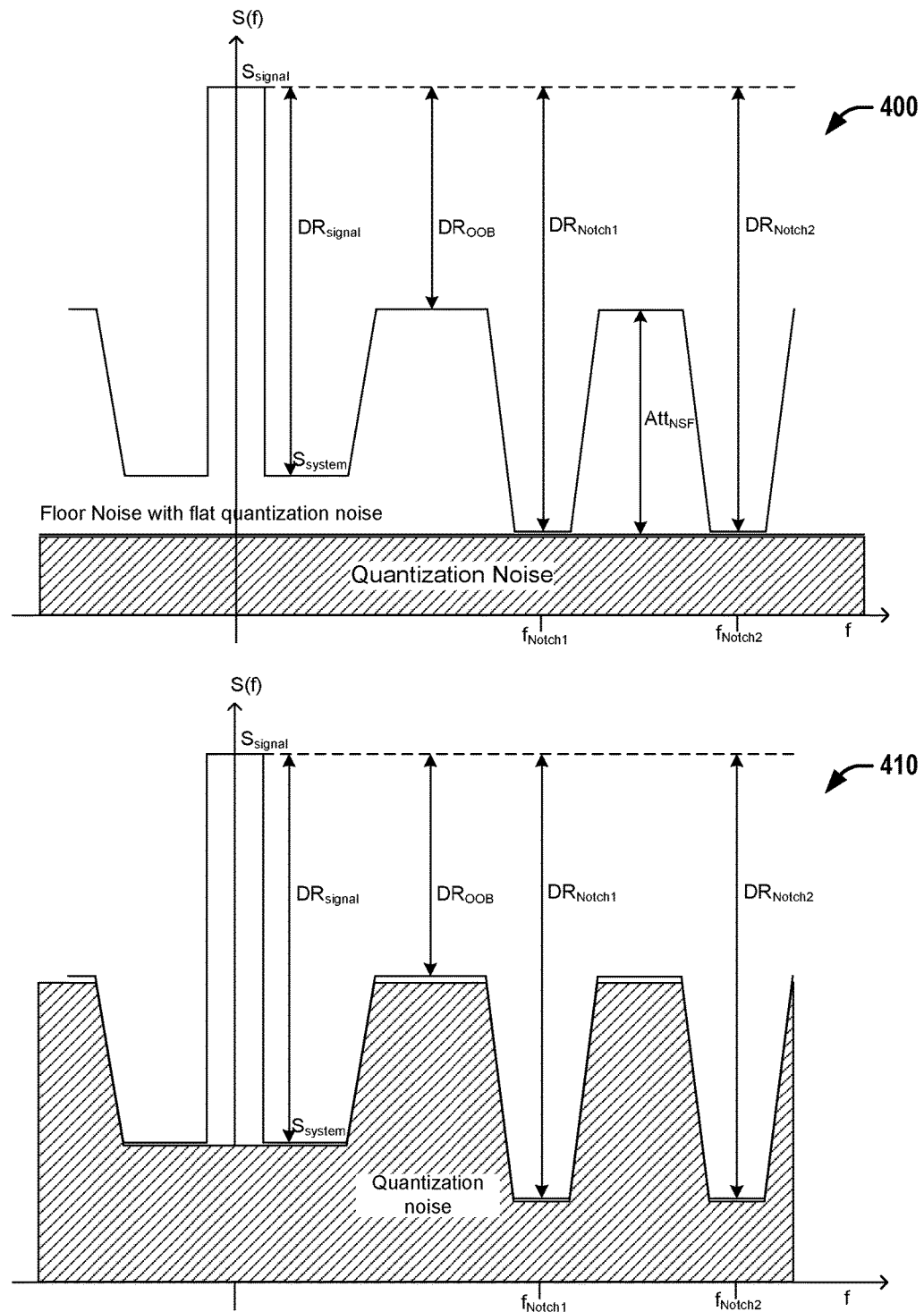
FIG. 4 is a pair of diagrams illustrating a comparison between (idealized) conventional noise shaping techniques based on floor noise with flat quantization noise and quantization noise from noise shaping techniques discussed herein.

Referring to FIG. 4, illustrated is a comparison between (idealized) conventional noise shaping techniques based on floor noise with flat quantization noise at 400 and quantization noise from noise shaping techniques discussed herein at 410. Both techniques can meet the spectral mask of FIG. 3, but techniques discussed herein can satisfy the spectral mask of FIG. 3 or an arbitrary spectral mask with a less complex and costly system, such as via a lower resolution DAC and/or less stringent front-end filtering.

As can be seen in FIG. 4, in various aspects, noise shaping techniques discussed herein can be employed to perform noise shaping of the noise of a Tx (transmit) signal to meet various spectral shape characteristics of a spectral mask. As a first example, frequency regions outside of a bandwidth for a Tx signal ($BW_{signal}$) can have a noise (e.g., magnitude in dB, etc.) below a first noise threshold for out-of-band noise (e.g., as shown by $DR_{OOB}$ in FIG. 4), such that both out-of-band noise is below the first noise threshold, and noise within a system bandwidth ($BW_{system}$) but outside of the $BW_{signal}$ can also be at or below the first noise threshold. Additionally, in aspects, one or more frequency regions can have a noise below one or more additional noise thresholds lower that are than the first noise threshold, while other frequency regions can have a noise above the one or more additional noise thresholds (but below the first noise threshold). As a second example, Tx noise in a system bandwidth ($BW_{system}$) can have a noise that is below a second noise threshold (e.g., $S_{system}$) in regions of the system bandwidth other than those used for the Tx signal, for example, to keep ACLR to acceptable levels. As a third example, one or more bandpass regions (e.g., of the same or different bandwidths, e.g., as shown in FIGS. 3 and 4) can be defined (e.g., that can be associated with Rx bands at the BS or UE employing aspects discussed herein), each of which can have an associated threshold (e.g., which can be the same or different, e.g., as shown in FIGS. 3 and 4), such that Tx noise in one or more Rx bands (e.g., for Rx bands employed by the UE or BS that generates the Tx signal) can have a noise at or below the associated threshold. In various aspects, the difference between the first threshold (for out-of-band noise) and the associated threshold(s) (for Rx band notches or one or more bandpass regions) can be any of a variety of attenuation values discussed herein or shown in the attached Figures (e.g., 40 dB, or lesser, or greater, such as values shown in FIG. 3).

Figure 5:
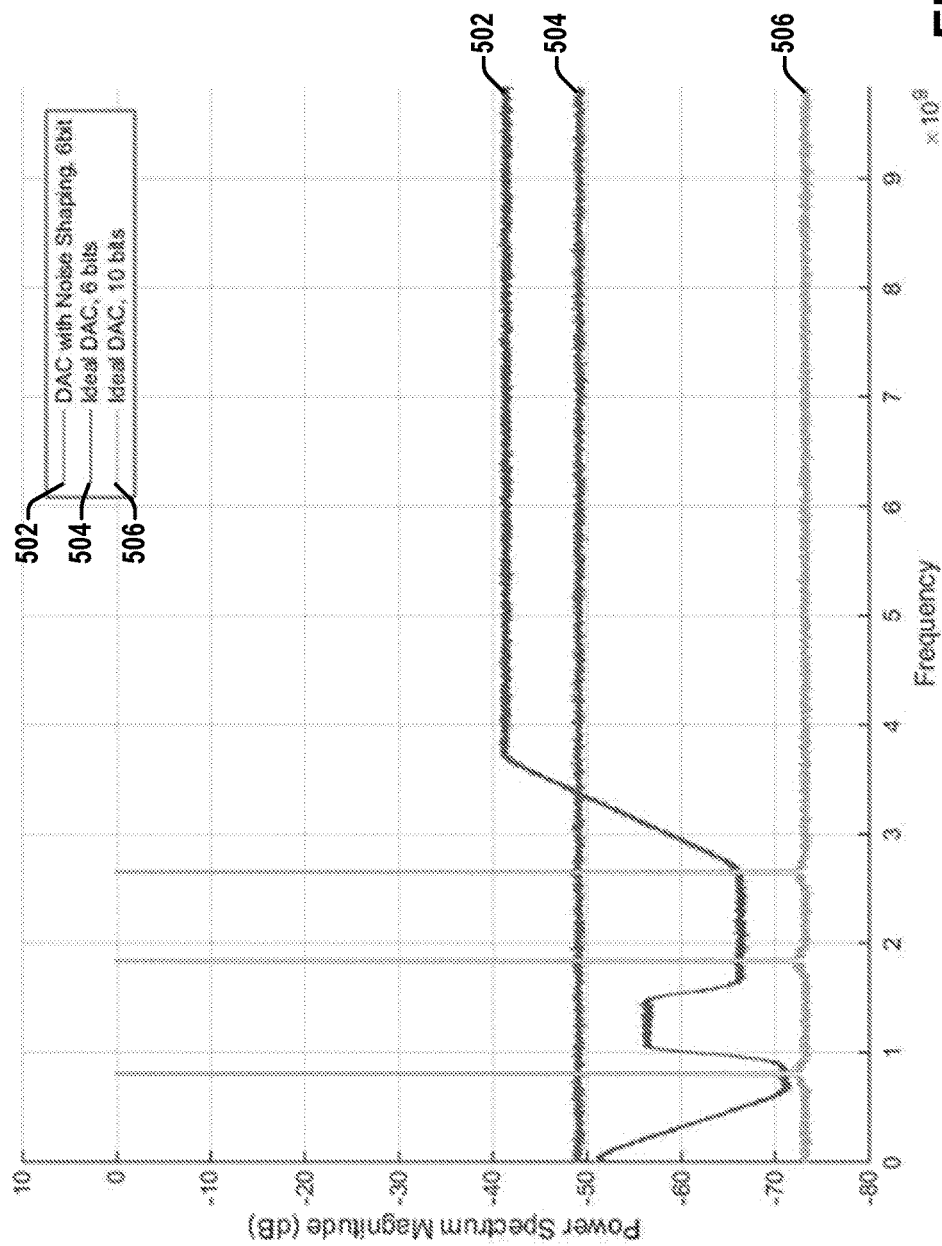
FIG. 5 is an example graph showing the result of applying noise shaping according to aspects discussed herein to a three carrier signal.

Referring to FIG. 5, illustrated is an example graph showing the result of applying noise shaping according to aspects discussed herein to a three carrier signal. The signals shown in FIG. 5 are the 20 MHz LTE carriers centered at 805, 1840 and 2655 MHz (inside LTE downlink bands B20, B3, and B7, respectively). Plot 502 shows the power spectrum based on applying a 6 bit DAC with noise shaping according to various aspects discussed herein, plot 504 shows the power spectrum for a 6 bit ideal DAC, and plot 506 shows the power spectrum for a 10 bit ideal DAC. As can be seen in FIG. 5, techniques discussed herein can facilitate noise shaping to meet a given spectral mask via a lower resolution DAC than conventional techniques.

Figure 6:
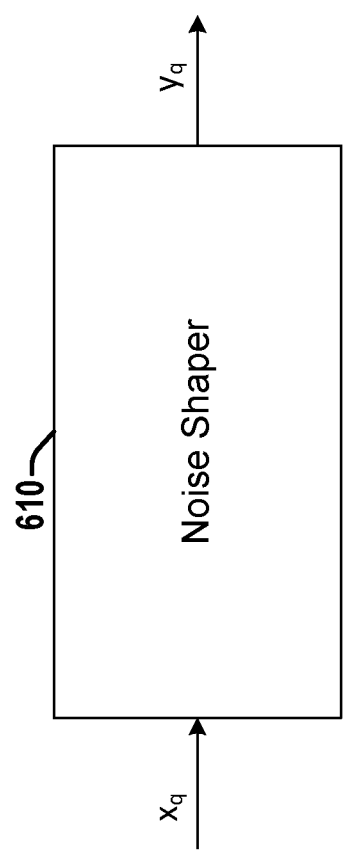
FIG. 6 is a block diagram of a first example noise shaper that can be employed to shape noise to meet an arbitrary spectral mask, according to various aspects discussed herein.

In various aspects, techniques discussed herein can be employed to fulfill spectral shape characteristics via noise shaping that can be employed via a coarser DAC than in conventional systems, which can be easier to design than a very high resolution DAC. Referring to FIG. 6, illustrated is a first example noise shaper 610 that can be employed to shape noise to meet an arbitrary spectral mask, according to various aspects discussed herein. In various aspects, noise shaper 610 can be any of a variety of types of noise shapers, such as a delta-sigma, a pyramid encoder as described herein, etc. In various aspects, filter taps of noise shaper 610 can be pre-computed in the frequency domain to design the inverse of a target shape for filter synthesis from which the impulse response can be derived, which can allow for a highly controlled response in both the Tx band and Rx band(s). The filter tap values can then be calculated in the time domain based on the pre-computed frequency domain shape. Based on the design of noise shaper 610, noise shaper 610 can generate, from a given input signal $x_q$ (e.g., a transmit signal to be transmitted by a transmitter employing noise shaper 610), a noise-shaped output signal $y_q$ (e.g., a noise shaped transmit signal to be transmitted by a transmitter employing noise shaper 610) that meets a spectral mask associated with the design of noise shaper 610.

Figure 7:
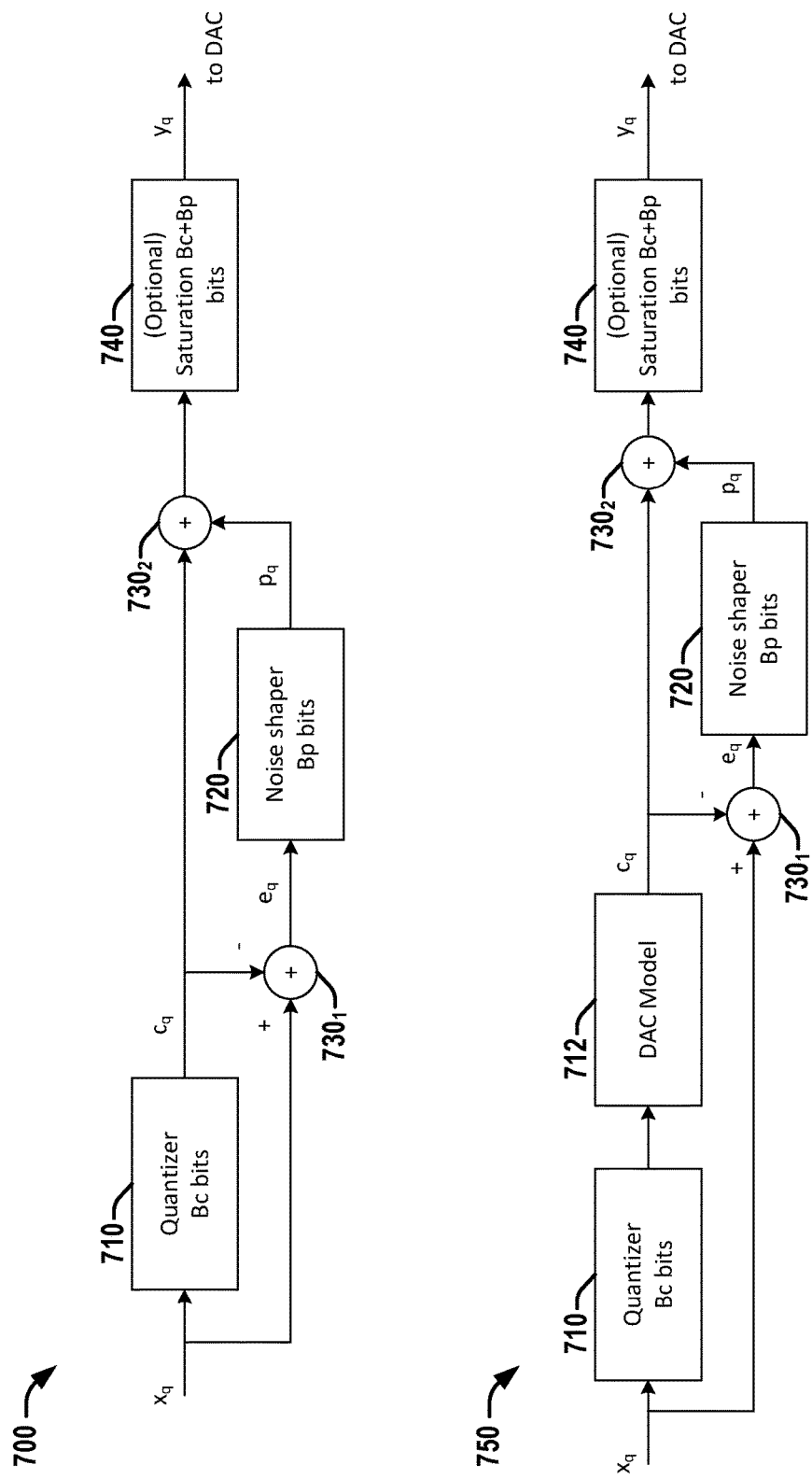
FIG. 7 illustrates a pair of block diagrams showing a first example two stage noise shaper and a second example two stage noise shaper, each of which can be employed as a noise shaping filter in a communication device of a wireless communication system (e.g., a UE or a BS), according to various aspects discussed herein.

In various aspects, noise shaper 610 can be a single stage noise shaper, while in other aspects, noise shaper 610 can be a multi-stage (e.g., of two or more stages, such as the two-stage noise shapers discussed below in connection with FIG. 7).

In some aspects, in order to reduce the complexity of the noise shaper, noise shaping can be performed on the $B_p$ LSB (Least Significant Bits) of a By (e.g., $=B_p+B_p$) bit quantization of the transmit signal, where the values of $B_c$ and $B_p$ (which can be positive integers) can vary between embodiments. Referring to FIG. 7, illustrated is a pair of block diagrams of a first example two stage noise shaper 700 and second example two stage noise shaper 750, each of which can be employed as a noise shaping filter in a communication device of a wireless communication system (e.g., a UE or a BS), according to various aspects discussed herein.

Example apparatus 700 can comprise a quantizer 710 (e.g., which can be a conventional or proprietary quantizer, etc.), a noise shaper (e.g., single stage) 720 (e.g., which can be of any type, such as a delta-sigma or pyramid as described in greater detail herein), and adders $730_i$, which can provide a noise shaped input to saturation circuitry 740, which can provide an output signal $y_q$ via saturation arithmetic to a DAC.

It can be shown that the number of bits $B_c$ for the quantizer 710 and the noise-shaped number of bits $B_p$ can be given respectively by equations (1) and (2), which are approximations for low noise:

$$B_c = \left\lceil 1 - \log_2\left(12\sqrt{\frac{P_s f_s}{DR BW_{signal}}}\right)\right\rceil \quad (1)$$

$$B_p = \left\lceil 1 - \log_2\left(12\sqrt{\frac{P_s\left(\frac{BW_{system}}{A_{system}} + BW_{OOB} + \frac{2BW_{Notch1}}{A_{Notch1}} + \frac{2BW_{Notch2}}{A_{Notch2}}\right)}{DR_{OOB} BW_{signal}}}\right)\right\rceil \quad (2)$$

where $P_s$ is the sampling noise power, $f_s$ is the sampling noise frequency, DR is a dynamic range (e.g., OOB (Out-of-band, etc.)), BW is a bandwidth (e.g., system, notch1, notch2, signal, etc.), and A is an attenuation introduced by noise shaping (e.g., system, notch1, notch2, etc.). It can be shown that $B_p \leq B_c$, which can take advantage of the effect of the attenuation in the system and notch bands. Although the specific form of $B_p$ relates to a two-notch spectral mask such as that shown in FIGS. 3-5, similar results can be shown for other spectral masks.

Quantizer 710 can output at $c_q$ the $B_c$ MSB (most significant bits) of a $B_y$ bit quantization of the input $x_q$ (e.g., which can be a floating point signal, or a $B_x$ bit signal, where $B_x$ can be $\geq B_y$). Adder $730_1$ can subtract quantizer 710 output signal $c_q$ from transmit signal $x_q$ to provide input signal $e_q$ (which can comprise the $B_p$ LSB of a $B_y$ bit quantization of signal $x_q$) to noise shaper 720 (e.g., delta-sigma, pyramid encoder, etc.). Noise shaper 720 can perform noise shaping on signal $e_q$ to generate a noise shaped output signal $p_q$, which can be combined by adder $730_2$ to generate an output signal $y_q$ as a $B_y$ bit version of signal $x_q$ with noise shaping of the $B_p$ LSB.

The split in the $B_c$ bits for the quantizer 710 and the $B_p$ bits for noise shaper 720 can depend on the filter properties. For example, a smaller $B_p$ can allow for lower complexity, and thus can be advantageous (especially in UE embodiments). As can be seen in Table 1, below, for medium attenuation (e.g., 40 dB), 3 level noise shaper quantization is possible:

TABLE 1

Example Values of $B_c$ and $B_p$ for Different Attenuations

| NSF attenuation | DAC bits ($B_c + B_p$) | $B_c$ | $B_p$ |
|---|---|---|---|
| 40 dB | 10 | 9 | 1.6 (3 levels) |
| 50 dB | 9 | 7 | 2.3 (5 levels) |
| 60 dB | 8 | 5 | 3.2 (9 levels) |

Some overlap between the encoding of quantizer 710 and noise shaper 720 can be included, which can guarantee stability of the noise shaper 720 section. In one example, the dynamic range of the quantizer 710 and noise shaper 720 can overlap by at least one bit (e.g., the n LSB of the quantizer 710 and the n MSB of the noise shaper 720, wherein n≥1). Thus, the noise shaper 720 can have $2^{B_p}+1$ levels. Noise added through this overlap can be removed by saturation circuitry 740. In a first specific example, $B_c$ can equal $B_y$, and the dynamic range of the quantizer 710 and noise shaper 720 can overlap by $B_p$ bits. A second specific example, for $B_x=16$, $B_c=4$, $B_p=3$, $B_y=7$, is shown in Table 2, below:

TABLE 2

Example Bit Values for $x_q$, $c_q$, $e_q$, $p_q$, $c_q + p_q$, and $y_q$

| | Sign | $2^0$ | $2^{-1}$ | $2^{-2}$ | $2^{-3}$ | $2^{-4}$ | $2^{-5}$ | $2^{-6}$ | $2^{-7}$ | ... | $2^{-15}$ |
|---|---|---|---|---|---|---|---|---|---|---|---|
| $x_q$ | X | 0 | X | X | X | X | X | X | X | X | X |
| $c_q$ | X | 0 | X | X | X | X | 1 | 0 | 0 | 0 | 0 |
| $e_q$ | X | 0 | 0 | 0 | 0 | 0 | X | X | X | X | X |
| $p_q$ | X | 0 | 0 | 0 | 0 | 0 | X | X | 0 | 0 | 0 |
| $c_q + p_q$ | X | X | X | X | X | X | X | X | 0 | 0 | 0 |
| $y_q$ | X | 0 | X | X | X | X | X | X | 0 | 0 | 0 |

Example apparatus 750 can comprise the components discussed in connection with example apparatus 700, and can additionally comprise a DAC (Digital-to-Analog Converter) model 712. One feature of noise shaping techniques employing a 2 stage noise shaper is that it is amenable to compensation of DAC nonlinearity. By including a model of the DAC response (for example in the form of a Look Up Table) such as DAC model 712 at the output of the Quantizer 710, the nonlinear error associated with the $B_c$ MSBs can be noise shaped in a similar way to the quantization noise shaped by noise shaper 720. This method is effective when $B_c \gg B_p$.

Figure 8:
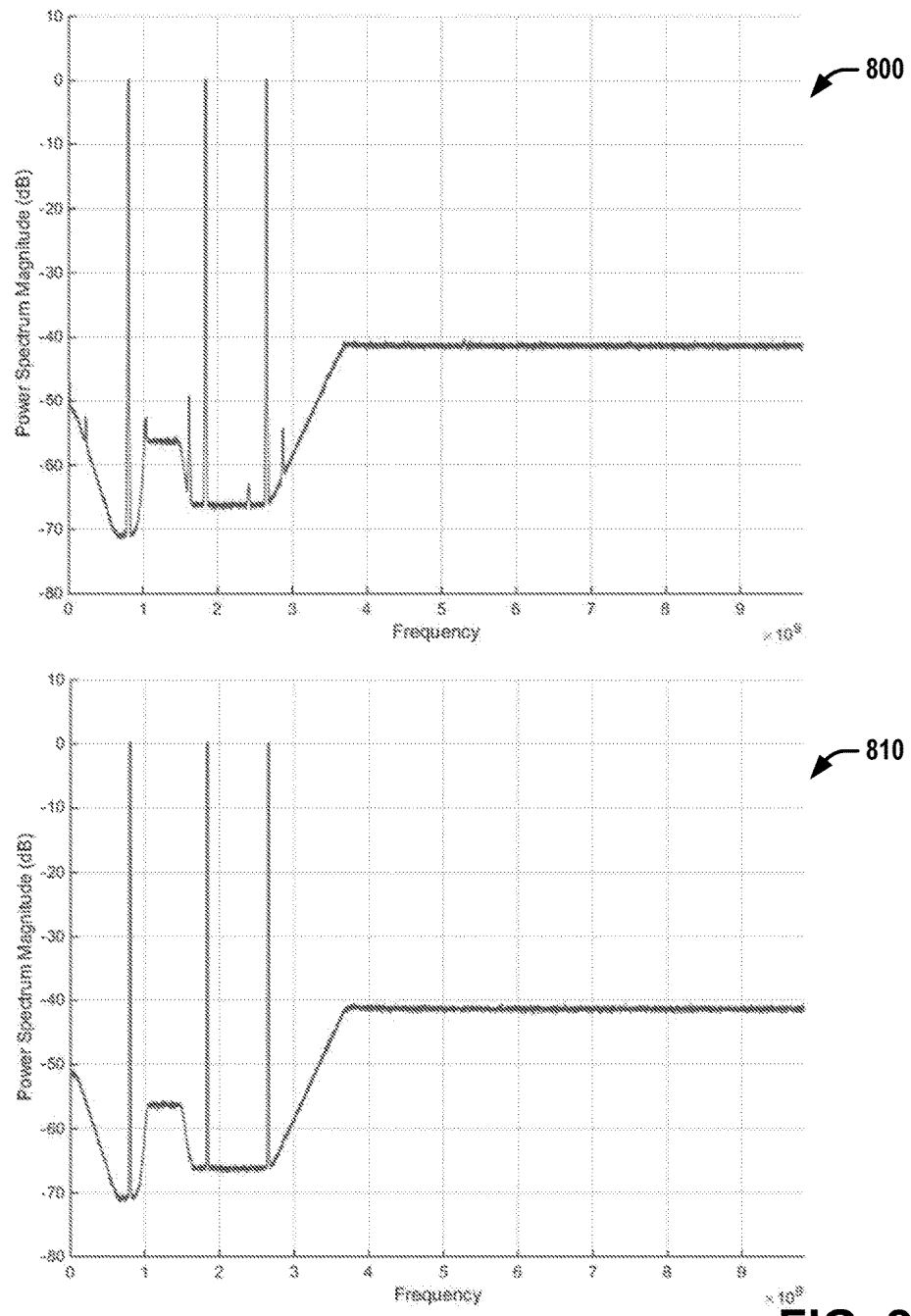
FIG. 8 illustrates a pair of example graphs that depict the result of applying DAC nonlinearity compensation techniques according to aspects discussed herein.

Referring to FIG. 8, illustrated are a pair of example graphs 800 and 810 that depict the result of applying DAC nonlinearity compensation techniques according to aspects discussed herein. Graph 800 shows a signal without DAC compensation, and graph 810 shows that signal with DAC nonlinearity compensation based on a static DAC nonlinear response of the form $y=x+0.05x^3$. In various aspects, similar techniques can be used in the presence of dynamic nonlinearity.

Figure 9:
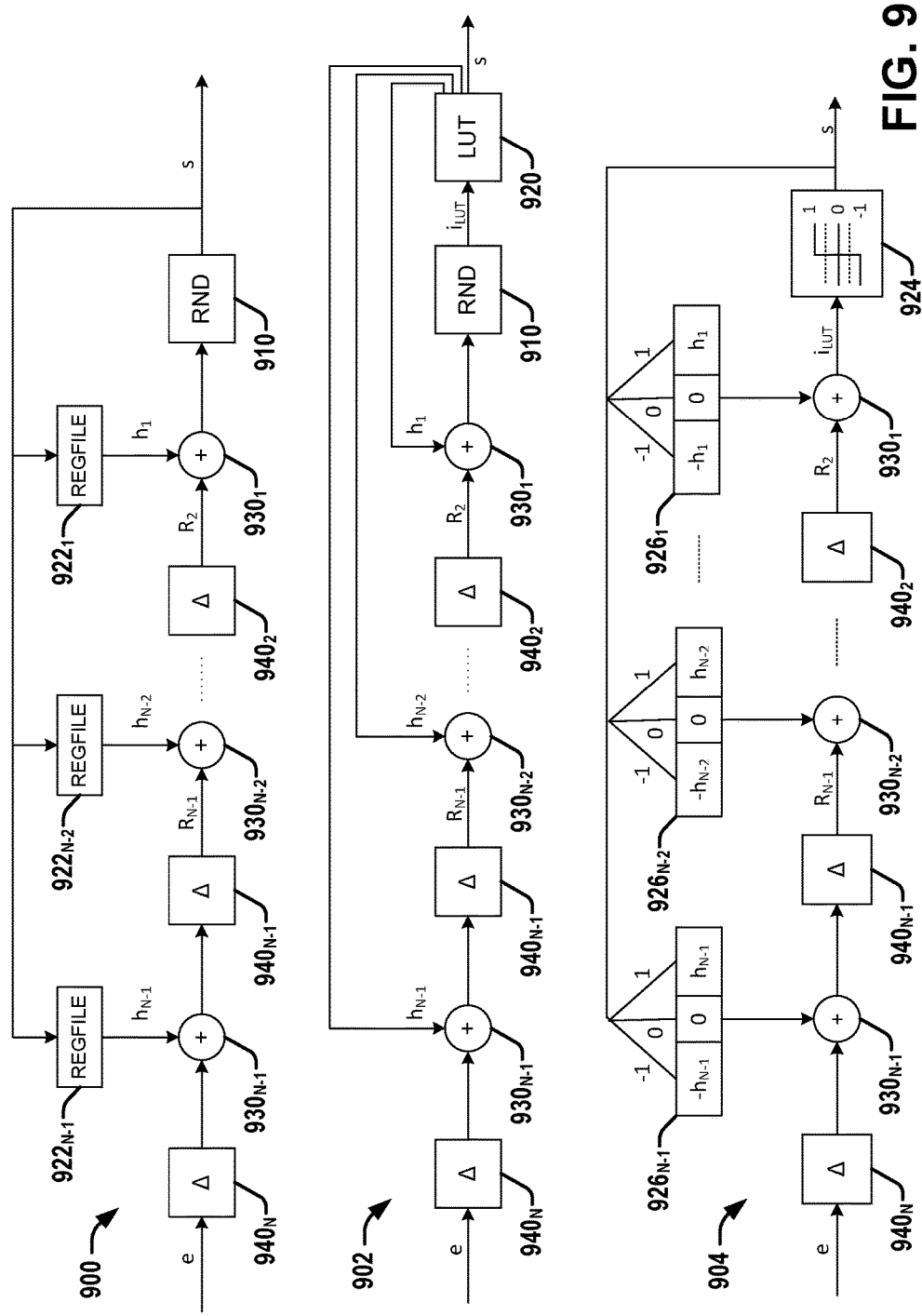
FIG. 9 illustrates three block diagrams showing various implementations of a pyramid encoder that can be employed as a noise shaper according to various aspects discussed herein.

Referring to FIG. 9, illustrated are three example implementations of a pyramid encoder that can be employed as noise shaper 720, example encoders 900, 902, and 904, according to various aspects discussed herein.

Each example encoder 902, 904, and 906 can receive a signal, e, at an initial delay element $940_N$ of a set of delay elements that can provide an output to an initial adder $930_{N-1}$ of a transversal, filter-like chain of adders.

Adders $930_i$ can combine an associated first received signal (e.g., input e, a signal from a previous delay element $940_{i+1}$) with an associated second received signal (e.g., a noise shaping filter tap signal $h_i$), and can output an associated combined signal. All adders $930_i$ other than a final adder $930_1$ can output the associated combined signal to a next delay element $940_i$.

The final adder $930_1$ can output its associated combined signal to a component that can vary based on the embodiment. For example, in embodiments 900 and 902, the final adder $930_1$ can output its associated combined signal to rounding circuitry 910. In embodiment 900, rounding circuitry 910 can provide an output signal s as an output of the noise shaper 720, which can be received as an input for regfiles $922_i$ that can generate the tap signals $h_i$ based on the received signal s. In embodiment 902, rounding circuitry 910 can provide an output signal $i_{LUT}$ to a LUT (Look-Up Table) 920 that can correspond to or implement the regfiles $922_i$ and can generate the tap signals $h_i$ and output signal s. In both embodiments 900 and 902, the number of bits $B_p$ can determine the number of entries in the corresponding regfile $922_i$ as N, which can be a nearest integer to $2^{B_p}$ (e.g., $B_p=9$ corresponds to 512 entries in the corresponding regfile $922_i$). Embodiment 904 provides a simplified alternative, wherein the final adder $930_1$ can output its associated combined signal to an M-level (e.g., wherein M=3 is shown in embodiment 904) quantizer 924. Based on the output of quantizer 924, each tap signal circuitry $926_i$ can generate one of M outputs for the corresponding tap signal $h_i$.

In aspects, the noise shaper 720 (in various embodiments) can operate a decimated rate while producing noise shaped digital symbols s(k) at an oversampled rate (this can reduces the operating clock frequency of the encoder). The coefficients of the prototype noise shaping filter (e.g., $h_i$, etc.) can be pre-computed and the inner product of codewords by these filter taps can be stored in a look-up table. In a case where decimation is not used in the encoder (e.g., decimation ratio D=1), an implementation using delta-sigma modulation can be obtained, as illustrated at 904 in an example with a 3-level quantizer.

As can be seen in FIG. 9, each of the pyramid encoder embodiments of the noise shaper 720 can be multiplier-less. In the case of delta-sigma modulation, the modulator can operate at the full rate.

In order to generate an arbitrary noise shape, the response of the filter can be created in the frequency domain. In various aspects, the implementation complexity can be proportional to the number of taps in the noise shaping filter, which depends on selectivity and sharpness of the filter. Using an inverse Fourier transform, the coefficients h(k) of the noise shaping filter can be computed. In order to reduce the number of taps (e.g., in UE embodiments, where cost and power concerns are more relevant), smoother transitions can be created, such as in FIG. 5.

Based on extensive simulations conducted in connection with various embodiments, it was verified that an arbitrary shape can be achieved, and the number, shape, and position of Rx notches (or other spectral mask characteristics) can be very flexible.

Figure 10:
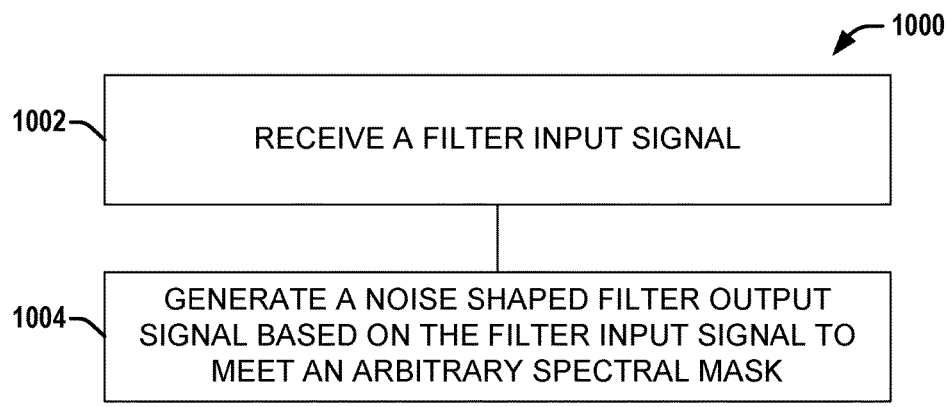
FIG. 10 illustrates a flow diagram of an example method of generating a noise shaped signal according to various aspects described herein.

Referring to FIG. 10, illustrated is a flow diagram of an example method 1000 of generating a noise shaped signal according to various aspects described herein. In some aspects, method 1000 can be performed at a transmitter (e.g., of a mobile device such as a UE or an access point such as an eNB or a gNB, etc.). In other aspects, a machine readable medium can store instructions associated with method 1000 that, when executed, can cause a transmitter to perform the acts of method 1000.

At 1002, a filter input signal $x_q$ can be received (e.g., floating point or high resolution ($B_x$ bits, etc.)).

At 1004, noise shaping can be applied to the input signal $x_q$ to generate a noise shaped output signal $y_q$ that conforms to a given spectral mask.

Additionally or alternatively, method 1000 can include one or more other acts described herein in connection with noise shaping techniques discussed herein.

Examples herein can include subject matter such as a method, means for performing acts or blocks of the method, at least one machine-readable medium including executable instructions that, when performed by a machine (e.g., a processor with memory, an application-specific integrated circuit (ASIC), a field programmable gate array (FPGA), or the like) cause the machine to perform acts of the method or of an apparatus or system for concurrent communication using multiple communication technologies according to embodiments and examples described.

Example 1 is an apparatus configured to be employed within a transmitter, comprising: a noise shaper configured to: receive an input signal $x_q$; and apply noise shaping to the input signal $x_q$ to generate a noise shaped output signal $y_q$, wherein an in-band noise of the noise shaped output signal $y_q$ is below an in-band noise threshold of a spectral mask associated with the noise shaper, wherein an out-of-band noise of the noise shaped output signal $y_q$ is below an out-of-band noise threshold of the spectral mask, and wherein a noise of the output signal $y_q$ in each of a plurality of bandpass regions is below an associated noise threshold for that bandpass region of the spectral mask.

Example 2 comprises the subject matter of any variation of any of example(s) 1, wherein the noise shaper is configured to compensate for DAC (Digital-to-Analog Converter) nonlinearities in the input signal $x_q$.

Example 3 comprises the subject matter of any variation of any of example(s) 1-2, wherein the noise shaper is further configured to employ delta-sigma modulation to apply noise shaping to the input signal $x_q$.

Example 4 comprises the subject matter of any variation of any of example(s) 1-2, wherein the noise shaper is further configured to employ pyramid encoding to apply noise shaping to the input signal $x_q$.

Example 5 comprises the subject matter of any variation of any of example(s) 4, wherein the noise shaper comprises: a pyramid encoder configured to receive a signal $e_q$ comprising the $B_p$ LSB (least significant bits) of the input signal $x_q$ and to generate a $B_p$ bit noise-shaped signal $p_q$ based on the signal $e_q$ and a plurality of filter taps of the pyramid encoder; and an adder configured to add the $B_p$ bit noise-shaped signal $p_q$ to a $B_c$ bit signal $c_q$ comprising the $B_c$ MSB (most significant bits) of the transmit signal to generate a combined signal $c_q+p_q$, wherein the noise shaper is configured to generate the noise shaped output signal $y_q$ based on the combined signal $c_q+p_q$.

Example 6 comprises the subject matter of any variation of any of example(s) 5, wherein the noise shaper further comprises saturation circuitry configured to apply saturation arithmetic to the combined signal $c_q+p_q$ to generate the noise shaped output signal $y_q$.

Example 7 comprises the subject matter of any variation of any of example(s) 5, wherein the $B_p$ bit noise-shaped signal $p_q$ and the $B_c$ bit signal $c_q$ overlap by at least one bit.

Example 8 comprises the subject matter of any variation of any of example(s) 1-2, wherein the out-of-band noise for at least a portion of an out-of-band region of the noise shaped output signal $y_q$ is above the associated noise threshold for each bandpass region of the spectral mask.

Example 9 comprises the subject matter of any variation of any of example(s) 1-2, wherein the noise shaper is configured to apply noise shaping to the input signal $x_q$ via a plurality of filter taps.

Example 10 comprises the subject matter of any variation of any of example(s) 9, wherein the noise shaper is configured to generate the filter taps based on a look-up table of pre-computed values for the plurality of filter taps.

Example 11 comprises the subject matter of any variation of any of example(s) 9, wherein the noise shaper is configured to generate the filter taps based on a M-level quantizer, wherein M is greater than or equal to 3.

Example 12 comprises the subject matter of any variation of any of example(s) 5-6, wherein the $B_p$ bit noise-shaped signal $p_q$ and the $B_c$ bit signal $c_q$ overlap by at least one bit.

Example 13 comprises the subject matter of any variation of any of example(s) 1-6 or 12, wherein the out-of-band noise for at least a portion of an out-of-band region of the noise shaped output signal $y_q$ is above the associated noise threshold for each bandpass region of the spectral mask.

Example 14 comprises the subject matter of any variation of any of example(s) 1-6 or 12-13, wherein the noise shaper is configured to apply noise shaping to the input signal $x_q$ via a plurality of filter taps.

Example 15 is an apparatus configured to be employed within a transmitter, comprising: a quantizer configured to receive a signal $x_q$ and to generate a $B_c$ bit signal $c_q$, wherein $B_c$ is a positive integer; a first adder configured to subtract the $B_c$ bit signal $c_q$ from the signal $x_q$ to generate a difference signal $e_q$; a noise shaper configured to receive the difference signal $e_q$ and to generate a noise-shaped $B_p$ bit signal $p_q$, wherein $B_p$ is a positive number less than $B_c$; and a second adder configured to combine the $B_c$ bit signal $c_q$ and the noise-shaped $B_p$ bit signal $p_q$ to generate a noise shaped $B_y$ bit signal $c_q+p_q$, wherein $B_y$ is a positive integer greater than $B_c$.

Example 16 comprises the subject matter of any variation of any of example(s) 15, further comprising saturation circuitry configured to receive the noise shaped $B_y$ bit signal $c_q+p_q$ and to generate a saturated noise shaped $B_y$ bit signal $y_q$.

Example 17 comprises the subject matter of any variation of any of example(s) 15, further comprising a DAC (Digital-to-Analog Converter) model configured to compensate for DAC nonlinearities in the input signal $x_q$.

Example 18 comprises the subject matter of any variation of any of example(s) 15-17, wherein the noise shaper is further configured to employ delta-sigma modulation to apply noise shaping to the input signal $x_q$.

Example 19 comprises the subject matter of any variation of any of example(s) 15-17, wherein the noise shaper is further configured to employ pyramid encoding to apply noise shaping to the input signal $x_q$.

Example 20 comprises the subject matter of any variation of any of example(s) 15-16, further comprising a DAC (Digital-to-Analog Converter) model configured to compensate for DAC nonlinearities in the input signal $x_q$.

Example 21 comprises the subject matter of any variation of any of example(s) 15-16 or 20, wherein the noise shaper is further configured to employ delta-sigma modulation to apply noise shaping to the input signal $x_q$.

Example 22 comprises the subject matter of any variation of any of example(s) 15-16 or 20, wherein the noise shaper is further configured to employ pyramid encoding to apply noise shaping to the input signal $x_q$.

Example 23 is a machine readable medium comprising instructions that, when executed, cause a transmitter to: receive an input signal $x_q$; and apply noise shaping to the input signal $x_q$ to generate a noise shaped output signal $y_q$, wherein an in-band noise of the noise shaped output signal $y_q$ is below an in-band noise threshold of a spectral mask associated with the noise shaper, wherein an out-of-band noise of the noise shaped output signal $y_q$ is below an out-of-band noise threshold of the spectral mask, and wherein a noise of the output signal $y_q$ in each of a plurality of bandpass regions is below an associated noise threshold for that bandpass region of the spectral mask.

Example 24 comprises the subject matter of any variation of any of example(s) 23, wherein the instructions, when executed, further cause the transmitter to compensate for DAC (Digital-to-Analog Converter) nonlinearities in the input signal $x_q$.

Example 25 comprises the subject matter of any variation of any of example(s) 23-24, wherein the instructions, when executed, further cause the transmitter to employ delta-sigma modulation to apply noise shaping to the input signal $x_q$.

Example 26 comprises the subject matter of any variation of any of example(s) 23-24, wherein the instructions, when executed, further cause the transmitter to employ pyramid encoding to apply noise shaping to the input signal $x_q$.

Example 27 is an apparatus configured to be employed within a transmitter, comprising: means for receiving an input signal $x_q$; and means for applying noise shaping to the input signal $x_q$ to generate a noise shaped output signal $y_q$, wherein an in-band noise of the noise shaped output signal $y_q$ is below an in-band noise threshold of a spectral mask associated with the noise shaper, wherein an out-of-band noise of the noise shaped output signal $y_q$ is below an out-of-band noise threshold of the spectral mask, and wherein a noise of the output signal $y_q$ in each of a plurality of bandpass regions is below an associated noise threshold for that bandpass region of the spectral mask.

Example 28 comprises the subject matter of any variation of any of example(s) 27, further comprising means for compensating for DAC (Digital-to-Analog Converter) non-linearities in the input signal $x_q$.

Example 29 comprises the subject matter of any variation of any of example(s) 27-28, wherein the means for applying noise shaping is configured to employ delta-sigma modulation to apply noise shaping to the input signal $x_q$.

Example 30 comprises the subject matter of any variation of any of example(s) 27-28, wherein the means for applying noise shaping is configured to employ pyramid encoding to apply noise shaping to the input signal $x_q$.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature may be combined with one or more other features of the other implementations as may be desired and advantageous for any given or particular application.

What is claimed is:

1. An apparatus configured to be employed within a transmitter, comprising:
    a noise shaper configured to:
        receive an input signal $x_q$; and
        apply noise shaping to the input signal $x_q$ to generate a noise shaped output signal $y_q$, wherein an in-band noise of the noise shaped output signal $y_q$ is below an in-band noise threshold of a spectral mask associated with the noise shaper, wherein an out-of-band noise of the noise shaped output signal $y_q$ is below an out-of-band noise threshold of the spectral mask, and wherein a noise of the output signal $y_q$ in each of a plurality of bandpass regions is below an associated noise threshold for that bandpass region of the spectral mask.

2. The apparatus of claim 1, wherein the noise shaper is configured to compensate for DAC (Digital-to-Analog Converter) nonlinearities in the input signal $x_q$.

3. The apparatus of claim 1, wherein the noise shaper is further configured to employ delta-sigma modulation to apply noise shaping to the input signal $x_q$.

4. The apparatus of claim 1, wherein the noise shaper is further configured to employ pyramid encoding to apply noise shaping to the input signal $x_q$.

5. The apparatus of claim 4, wherein the noise shaper comprises:
    a pyramid encoder configured to receive a signal $e_q$ comprising the $B_p$ LSB (least significant bits) of the input signal $x_q$ and to generate a $B_p$ bit noise-shaped signal $p_q$ based on the signal $e_q$ and a plurality of filter taps of the pyramid encoder; and
    an adder configured to add the $B_p$ bit noise-shaped signal $p_q$ to a $B_c$ bit signal $c_q$ comprising the $B_c$ MSB (most significant bits) of the transmit signal to generate a combined signal $c_q+p_q$,
    wherein the noise shaper is configured to generate the noise shaped output signal $y_q$ based on the combined signal $c_q+p_q$.

6. The apparatus of claim 5, wherein the noise shaper further comprises saturation circuitry configured to apply saturation arithmetic to the combined signal $c_q+p_q$ to generate the noise shaped output signal $y_q$.

7. The apparatus of claim 5, wherein the $B_p$ bit noise-shaped signal $p_q$ and the $B_c$ bit signal $c_q$ overlap by at least one bit.

8. The apparatus of claim 1, wherein the out-of-band noise for at least a portion of an out-of-band region of the noise shaped output signal $y_q$ is above the associated noise threshold for each bandpass region of the spectral mask.

9. The apparatus of claim 1, wherein the noise shaper is configured to apply noise shaping to the input signal $x_q$ via a plurality of filter taps.

10. The apparatus of claim 9, wherein the noise shaper is configured to generate the filter taps based on a look-up table of pre-computed values for the plurality of filter taps.

11. The apparatus of claim 9, wherein the noise shaper is configured to generate the filter taps based on a M-level quantizer, wherein M is greater than or equal to 3.

12. An apparatus configured to be employed within a transmitter, comprising:
    a quantizer configured to receive a signal $x_q$ and to generate a $B_c$ bit signal $c_q$, wherein $B_c$ is a positive integer;

a first adder configured to subtract the $B_c$ bit signal $c_q$ from the signal $x_q$ to generate a difference signal $e_q$;

a noise shaper configured to receive the difference signal $e_q$ and to generate a noise-shaped $B_p$ bit signal $p_q$, wherein $B_p$ is a positive number less than $B_c$;

a second adder configured to combine the $B_c$ bit signal $c_q$ and the noise-shaped $B_p$ bit signal $p_q$ to generate a noise shaped $B_y$ bit signal $c_q+p_q$, wherein $B_y$ is a positive integer greater than $B_c$; and saturation circuitry configured to receive the noise shaped $B_y$ B bit signal $c_q+p_q$ and to generate a saturated noise shaped $B_y$ bit signal $y_q$.

13. The apparatus of claim 12, further comprising a DAC (Digital-to-Analog Converter) model configured to compensate for DAC nonlinearities in the input signal $x_q$.

14. The apparatus of claim 12, wherein the noise shaper is further configured to employ delta-sigma modulation to apply noise shaping to the input signal $x_q$.

15. The apparatus of claim 12, wherein the noise shaper is further configured to employ pyramid encoding to apply noise shaping to the input signal $x_q$.

16. A non-transitory machine readable medium comprising instructions that, when executed, cause a transmitter to:

receive an input signal $x_q$; and apply noise shaping to the input signal $x_q$ to generate a noise shaped output signal $y_q$, wherein an in-band noise of the noise shaped output signal $y_q$ is below an in-band noise threshold of a spectral mask associated with the noise shaper, wherein an out-of-band noise of the noise shaped output signal $y_q$ is below an out-of-band noise threshold of the spectral mask, and wherein a noise of the output signal $y_q$ in each of a plurality of bandpass regions is below an associated noise threshold for that bandpass region of the spectral mask.

17. The machine readable medium of claim 16, wherein the instructions, when executed, further cause the transmitter to compensate for DAC (Digital-to-Analog Converter) nonlinearities in the input signal $x_q$.

18. The machine readable medium of claim 16, wherein the instructions, when executed, further cause the transmitter to employ delta-sigma modulation to apply noise shaping to the input signal $x_q$.

19. The machine readable medium of claim 16, wherein the instructions, when executed, further cause the transmitter to employ pyramid encoding to apply noise shaping to the input signal $x_q$.

\* \* \* \* \*